United States Patent
Ko

[19]

[11] Patent Number: 5,917,735
[45] Date of Patent: Jun. 29, 1999

[54] APPARATUS AND METHOD FOR COMPENSATING FOR TIMING AND PHASE ERROR USING A POLY-PHASE FILTER

[75] Inventor: Jung-wan Ko, Suwon, Rep. of Korea

[73] Assignee: Samsung Electronics Co., Ltd., Kyungki-do, Rep. of Korea

[21] Appl. No.: 08/741,122

[22] Filed: Oct. 30, 1996

[30] Foreign Application Priority Data

Oct. 30, 1995 [KR] Rep. of Korea ............ 95-38240

[51] Int. Cl.$^6$ .................................................. H03L 7/00
[52] U.S. Cl. ............................... 364/724.1; 375/229
[58] Field of Search ........................... 375/118, 229; 364/724.03, 724.13, 724.1

[56] References Cited

U.S. PATENT DOCUMENTS

| | | | |
|---|---|---|---|
| 4,780,892 | 10/1988 | Lagadec | 375/118 |
| 4,791,597 | 12/1988 | Miron et al. | 364/724.03 |
| 4,881,191 | 11/1989 | Morton | 364/724.13 |
| 5,311,457 | 5/1994 | Shizawa | 364/724.13 |

FOREIGN PATENT DOCUMENTS

0 562 851 A1  3/1993  European Pat. Off. ....... H03H 17/06

Primary Examiner—Ayaz R. Sheikh
Assistant Examiner—Omar A. Omar
Attorney, Agent, or Firm—Sughrue, Mion, Zinn, Macpeak & Seas, PLLC

[57] ABSTRACT

A poly-phase filter and an apparatus which compensates for timing error and a method for implementing such compensation are provided. The poly-phase filter can compensate for the timing and phase error of an input signal which occur in a time period which is shorter than the sampling period by obtaining impulse responses of a mother filter having a pass band of (Fs/2n) where Fs is the sampling frequency and n is a positive number, re-sampling the obtained impulse responses using a plurality of clock signals having a phase difference of (2*π/n s), and selecting one filter among the filter set having group delays corresponding to the detected phase, and filtering the input signal using the poly-phase filter constituted by a series of filter sets adopting the re-sampled respective impulse responses as transmitting characteristics of the element filters.

10 Claims, 12 Drawing Sheets

APPARATUS AND METHOD FOR COMPENSATING FOR TIMING AND PHASE ERROR USING A POLY-PHASE FILTER

BACKGROUND OF THE INVENTION

The present invention relates to a poly-phase filter and a filter apparatus which compensates for timing and phase error in a digital signal and a method for implementing such compensation. More particularly, the invention relates to a poly-phase filter which compensates for a phase error, a timing error, and a group delay characteristic occurring in a time period which is shorter than the sampling period of sampled data. Additionally, the invention relates to a method for providing such compensation when using a poly-phase filter.

Increased recording density of storage media requires a relatively fast processing speed. Therefore, a digital signal processing method is used instead of an existing analog signal processing method. In a recorder or transmitter, image and audio signals are sampled and converted into digital signals and the digital signals are coded and transmitted or stored in the recording medium In a reproducer or a receiver, the transmitted signal undergoes digital signal processing and is reproduced to convey information of the original signal. As a result of using digital techniques, problems associated with sampling phase error and a timing error correction occur. For example, when a digital PLL (phase locked loop) circuit is used for signal correction, it is difficult to realize the digital PLL circuit which requires a high degree of accuracy since the digital PLL has a high operation frequency and a feedback loop.

During digital signal processing, a group delay circuit having a particular sampling period can be constituted using a delay device such as a D flip-flop. However, a circuit in which the group delay is shorter than the sampling period can only be constituted using a filter. The most widely known circuit in which the group delay is shorter than the sampling period is a Hilbert filter having a phase shift of 90°. When the sampling period is normalized, the Hilbert filter has a group delay equivalent to ½ of the sampling period. The group delay of the filter is the characteristic showing how long that the signal passed through the filter is delayed. Generally, the group delay corresponds to differentiated phase characteristics of the filter. Here, a phase error follows the same concept as the group delay error, the only difference being the value (phase or time) used as a mediation variable. When the phase error is generated in a present input signal, the signal itself falls behind or precedes a reference time for the signal.

Generally, in the digital filter, the phase error is compensated for by designing a compensating filter using an inverse Fourier transform according to frequency and phase characteristics of a group delay. However, this method cannot be applied to a system in which the group delay characteristics vary over time.

SUMMARY OF THE INVENTION

It is an object of the present invention to provide a poly-phase filter which compensates for time-varying characteristics, ie., characteristics which change over a time period which is shorter than a sampling period used for digital signal processing It is another object of the present invention to provide a poly-phase filter comprising a plurality of low pass FIR (finite impulse response) filters having different group delay characteristics It is still another object of the present invention to provide a poly-phase filter constituted of a plurality of low pass FIR (finite impulse response) filters using a Kaiser window method and having different group delay characteristics.

It is yet another object of the present invention to provide a simply constructed device for compensating for timing error and phase error which occur in a time period which is shorter than the sampling period for digital signal processing It is still another object of the present invention to provide a method for compensating for timing error and phase error which occur in a time period which is shorter than the sampling period generated during the digital signal processing.

To achieve the above objects, there is provided a poly-phase filter constituted of a series of filter sets having different group delay characteristics The filter set is obtained by impulse responses from a mother filter having a passband of (Fs/2n) where Fs is a sampling frequency and n is an integer. The obtained impulse responses are down-sampled according to a plurality of clock signals having a phase difference of $(2*\pi/n\ s)$ and using the down-sampled respective impulse responses as transmitting characteristics of the respective element filters of the filter set.

There is also provided a device for compensating for a timing error of an input signal comprising a phase detecting means for detecting the timing error of the input signal, a filter set where the element filters are spaced by a certain increment and have different group delay characteristics, and a poly-phase filter for filtering the input signal using an element filter selected from among the filter set. The filter is selected to compensate for the group delays corresponding to the detected phase and timing error.

The present invention also provides a method for compensating for a timing error of an input signal, comprising the steps of (a) detecting the phase and timing error of the input signal using an absolute value of two adjacent sample data which have opposite polarity, (b) obtaining impulse response characteristics of a mother filter having a pass band of (Fs/2n) where Fs is a sampling frequency and n is an integer, (c) down-sampling the obtained impulse response characteristics by a plurality of clock signals having a phase difference of $(2*\pi/n\ s)$, (d) generating a series of filter sets having different group delay characteristics and adopting the respective impulse responses obtained by the down-sampling as transmitting characteristics of the respective element filters, (e) selecting a filter among the filter set generated in step (d) to compensate for the group delays corresponding to the phase and timing error detected in step (a) and (f) filtering the input signal using the filter selected in the step (e).

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE PREFERRED EMBODIMENT

Hereinafter, an embodiment of a poly-phase filter according to the present invention is described.

The poly-phase filter of the present invention is a set of filters separated from a transmitting function of a mother filter. Each separated filter, which are collectively referred to as element filters, have different group delay characteristics and the group delay has a uniform increment.

Namely, a plurality of respective element filters constituting the poly-phase filter are configured on the basis of an interpolation method. The filters have the same amplitude characteristics but different group delays. However, the group delays of the filters maintain linear characteristics within a given scope. Thus, the poly-phase filter is the set of linear filters having the same amplitude characteristics, but different group delay characteristics Here, the mother filter is defined as a low pass FIR filter whose cut-off frequency is 1/n and which has L*n taps. The frequency characteristic of the mother filter is shown in FIG. 1.

Figure 1:
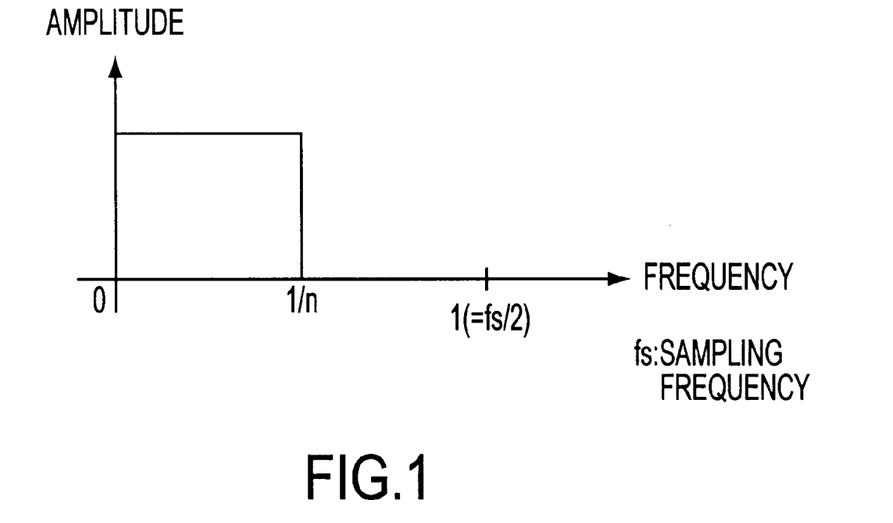
FIG. 1 shows frequency characteristics of a low pass filter having a cut-off frequency of 1/n.
Figure 2:
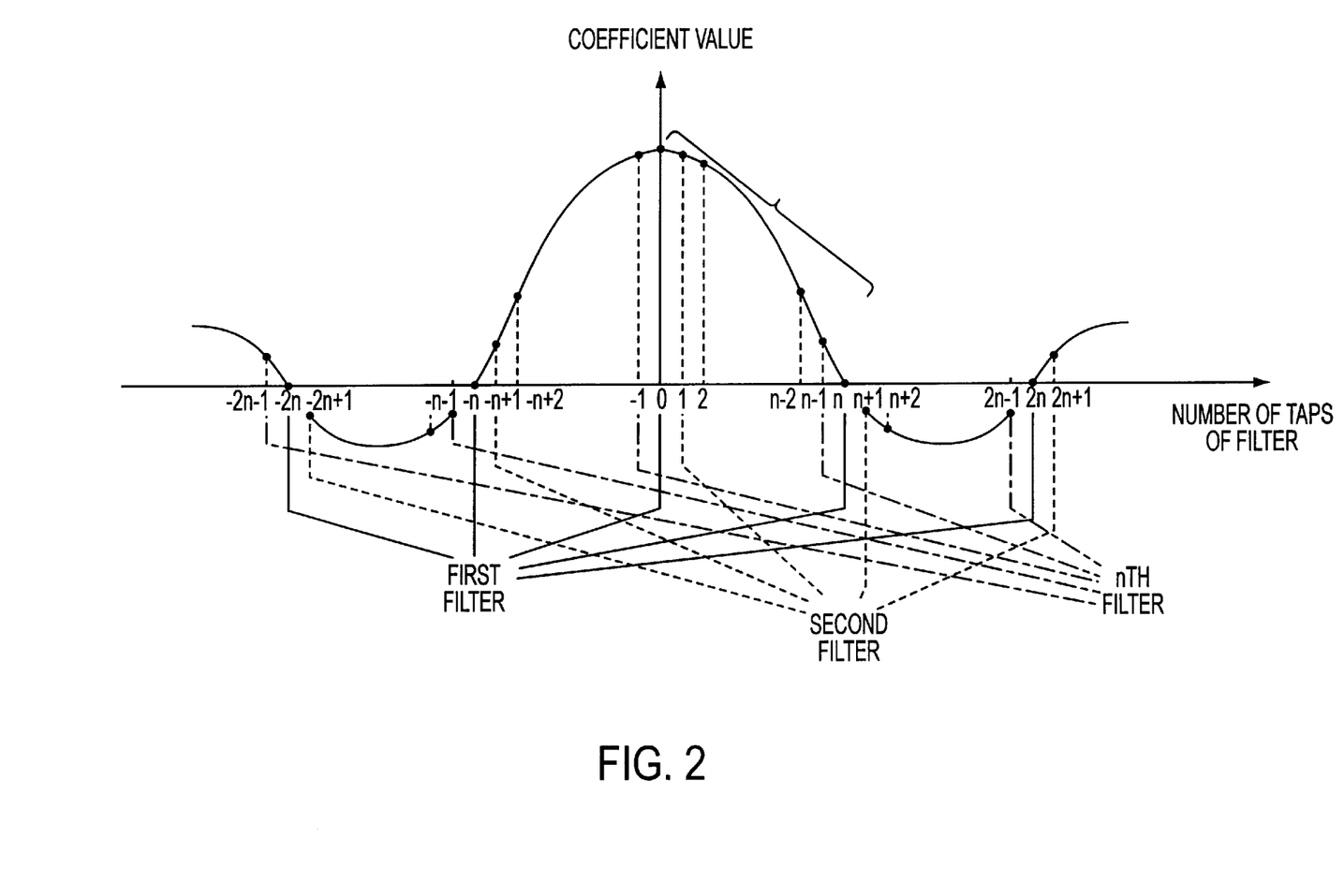
FIG. 2 is a drawing for explaining a plurality of element filters formed by decimating impulse characteristics of the low pass filter shown in FIG. 1.

Impulse response characteristics of the mother filter having the frequency characteristic shown in FIG. 1 are shown in FIG. 2.

When the impulse response characteristics of the mother filter shown in FIG. 2 are decimated to 1/n by a clock signal having a phase of (2π/n), the n element filters constituted of the first filter having sample data of −2n, −n, 0 (a central tap), n, 2n, the second filter having sample data of −2n+1, −n+1, 1, n+1, 2n+1, the nth filter having sample data of −2n−1, −n−1, −1, n−1, 2n−1 can be formed.

Figure 3:
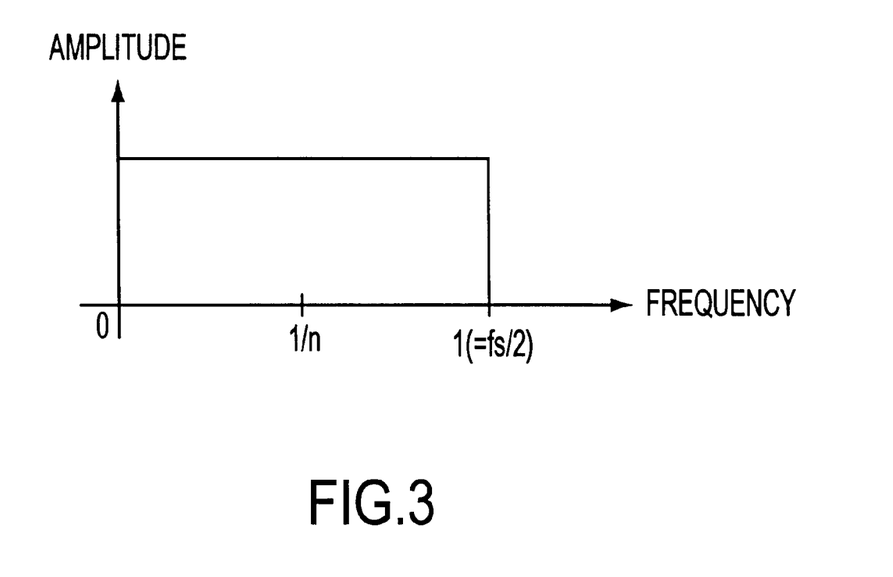
FIG. 3 shows the frequency characteristics of the respective element filters whose characteristics are shown in FIG. 2.

When the impulse response of the low pass filter having the cut-off frequency of (1/n) is n times decimated to (1/n), increasing the phase of the decimation clock signal by (2π/n s), the frequency characteristics of the respective element filters have the characteristics of an all pass filter as shown in FIG. 3.

At this time, the respective impulse responses of the decimated n element filters can be considered as coefficients of the element filters. Here, the phase of the decimation clock signal is proportionate to the group delay characteristics.

Figure 4:
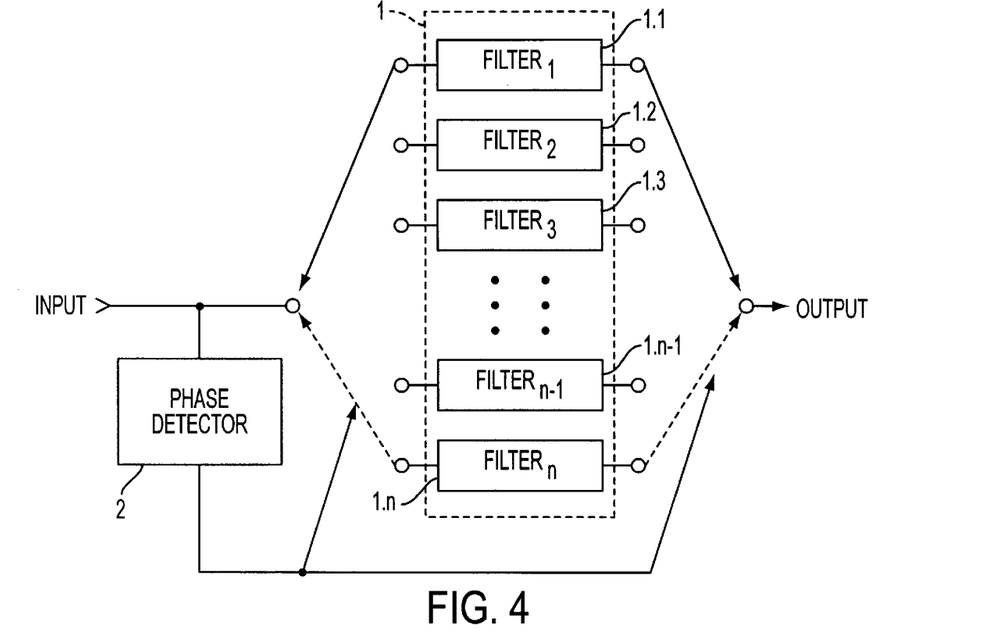
FIG. 4 is a block diagram which shows an embodiment of a poly-phase filter according to the present invention.

FIG. 4 shows a block diagram of an embodiment of the poly-phase filter according to the present invention. According to FIG. 4, a poly-phase filter 1 is constituted of n filters (1.1~1.n) having different group delay characteristics. A phase detector 2 detects the phase of an input and selects one filter among the n filters (1.1~1.n) corresponding to the detected phase. A phase compensated signal is output when the input is filtered by the selected filter.

The group delay (Gn) of the poly-phase filter 1 can be calculated using the following formula (1).

$$Gn = \frac{L-1}{2} + \frac{nT_s}{m} \quad (1)$$

Here, m, L, and Ts respectively denote an integer, a number of taps of the filter set, and a sampling period. It is noted that [(L−1)/2] corresponds to the delay of the filter set itself.

The following assumptions are made in order to design the poly-phase filter 1 using the above formula (1).

1) A primary timing error occurring in an input signal is corrected by a PLL (not shown).

2) The maximum angle of a given phase error is not more than ±180°.

3) The value of m is a large positive number and m=n.

4) The input signal is sampled using an appropriate sampling frequency.

The difference between the group delay of the first filter and that of the nth filter becomes one sampling period under the above conditions. In addition, the difference between the group delay of adjacent filters is ($T_s$/n).

The mother filter, i.e., the low pass FIR filter, whose pass band is $F_{Nyquist}$/n(=Fs/2n) and whose number of taps is L×n, is used to design the filter set including the first filter to the nth filter. Fs is the sampling frequency.

Figure 5:
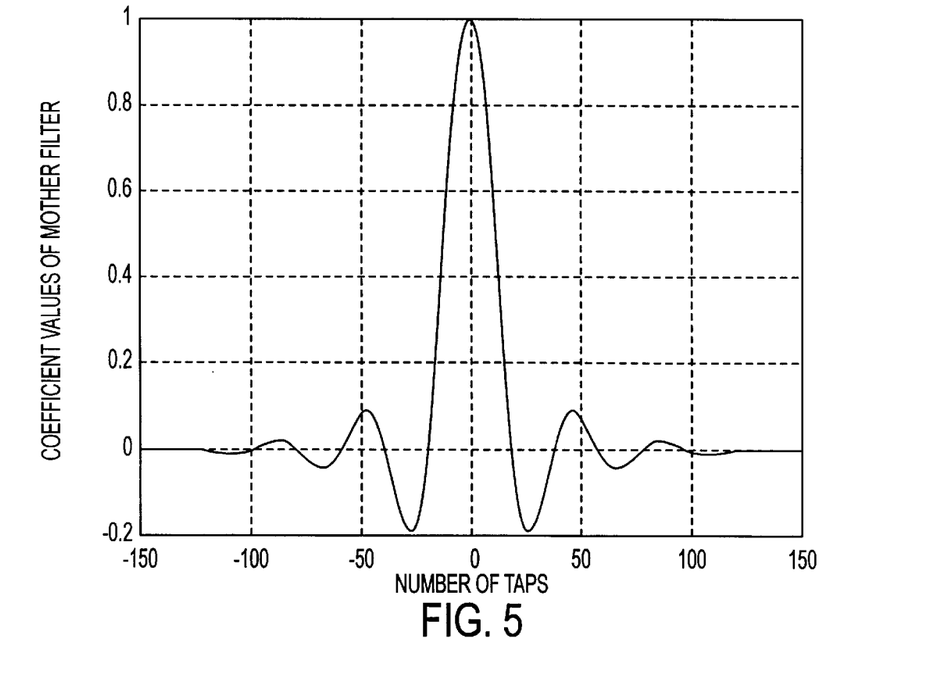
FIG. 5 shows impulse response characteristics of a mother filter of the filter set shown in FIG. 4.

Here, in the case where L=15 and n=20, the impulse response characteristics of the mother filter are shown in FIG. 5.

According to FIG. 5, the horizontal axis shows 150 filter taps to the left and right of a central tap at 0 and the vertical axis shows the coefficient values of the mother filter.

Figure 6:
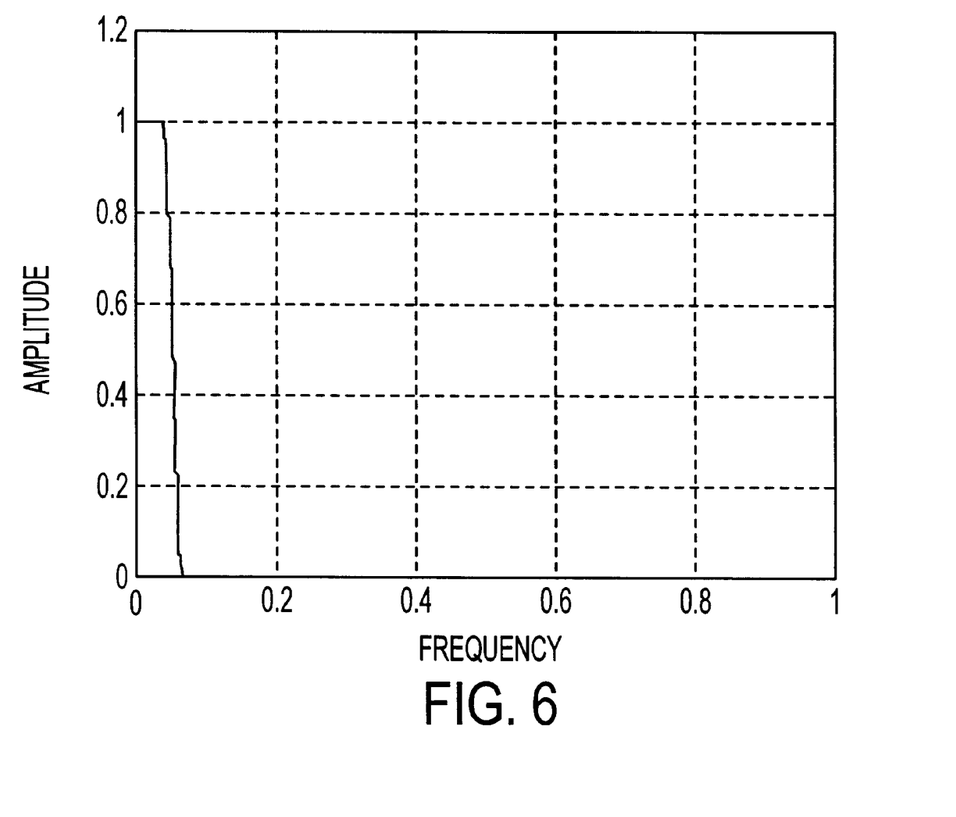
FIG. 6 shows the frequency characteristics of the mother filter having the impulse characteristics shown in FIG. 5.

FIG. 6 shows the frequency characteristics of the mother filter having a pass band of (1/20). When a Nyquist frequency (half of a sampling frequency) is normalized as 1, the horizontal axis shows the frequency and the vertical axis shows the amplitude.

Therefore, when the impulse response of the mother filter shown in FIG. 5 is decimated by 1/20, increasing the phase of the decimation clock signal by (2π/n s), the impulse response H of the mother filter is calculated using the following formula (2).

$$H = \sum_{i=0}^{Ln} b_i z^{-i} \qquad (2)$$

The mth impulse response which is decimated, i.e., $Hs_m$ can be calculated using the following formula (3).

$$Hs_m = \sum_{i=0}^{L-1} b_{ni+m} z^{-(ni+m)} \qquad (3)$$

Here, $L \leq m \leq n$.

Since the mother filter is decimated as above, the respective element filters of the filter set having the decimated impulse response as the transmitting function have the characteristics of the all pass filter as shown in FIG. 3. However, the group delay characteristics $G_i$ of the respective element filters are calculated as follows since the phase of the decimation clock signal is increased by $(2\pi/n \text{ s})$.

$$G_i = \left( \frac{L-2}{2} + \frac{i}{n} \right) \cdot T_s \qquad (4)$$

Here, $1 \leq i \leq n$ (i and n are integers) and $G_i$, L, and $T_s$ respectively denote the group delay of the filter at time i, the number of taps of the filter set, and the sampling period.

Figure 7:
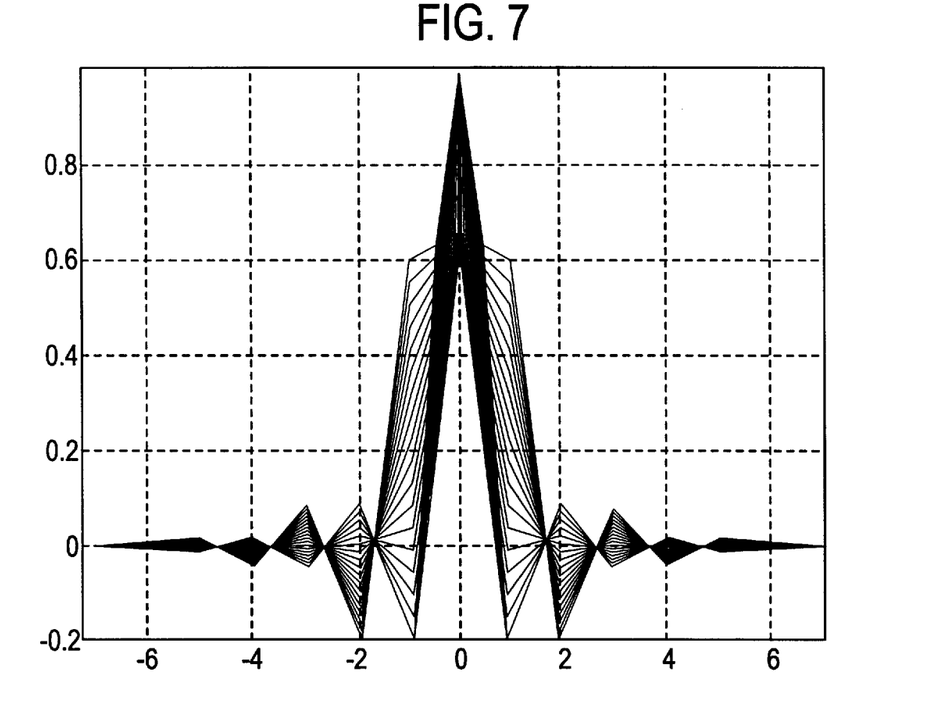
FIG. 7 shows the impulse response characteristics of the filter set shown in FIG. 4.

FIG. 7 shows the impulse response characteristics of the filter set shown in FIG. 4 and 20 impulse responses in which the impulse responses of the mother filter having the pass band of (1/20) are decimated to (1/20). The horizontal axis shown in FIG. 7 displays 15(=n*L/n) taps to the left and right of the central tap at 0 and the vertical axis displays the coefficients of the filter.

Figure 8:
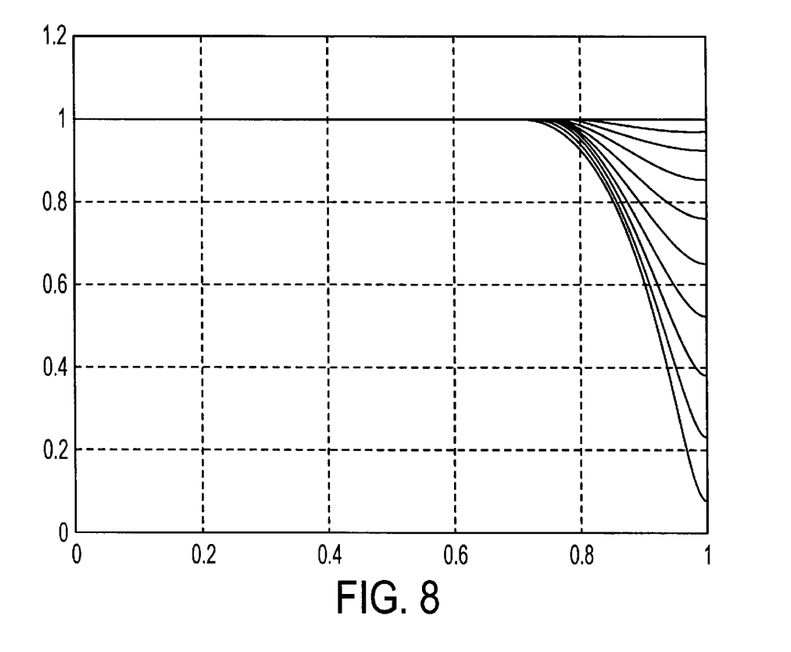
FIG. 8 shows the frequency characteristics of the filter set shown in FIG. 4.

FIG. 8 shows the frequency characteristics of the filter set shown in FIG. 4, namely, those corresponding to the 20 impulse responses shown in FIG. 7. Only 10 of the 20 frequency characteristics are shown in the figure since the filters, which are symmetrical about the time axis, have the same characteristics. As shown in FIG. 8, the band pass characteristics of the 20 element filters have low pass filter characteristics and the same amplitude characteristics The horizontal axis displays the frequency when the Nyquist frequency is normalized as 1 and the vertical axis displays the amplitude.

Figure 9:
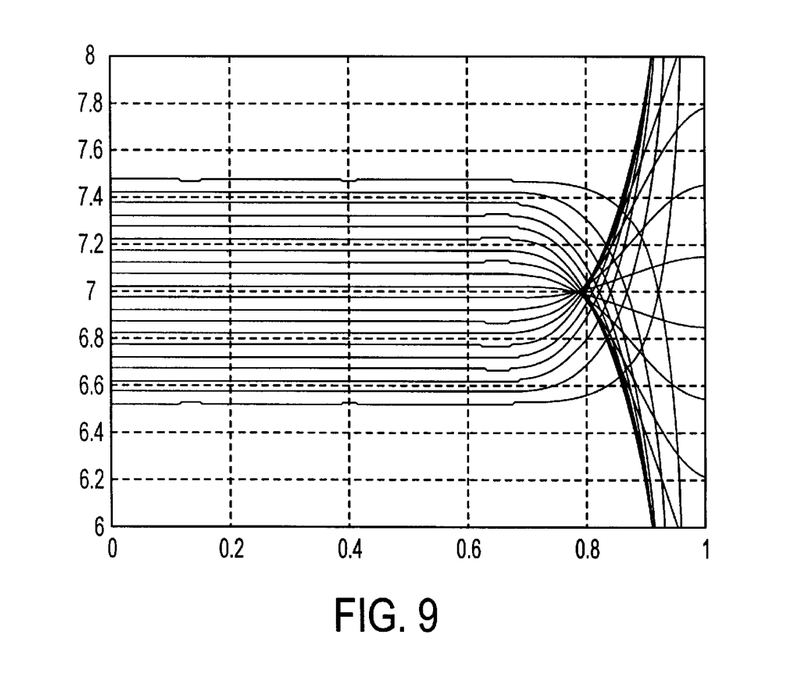
FIG. 9 shows group delay characteristics of the filter set shown in FIG. 4.

FIG. 9 shows the group delay characteristics of the 20 impulse responses shown in FIG. 7. The average group delay of a linear low pass symmetric filter is (L-1)/2. In this case, the average group delay of the filter set is 7 sampling periods, since the number of taps L of the filter set is 15. Meanwhile, the group delays of the respective filters have a difference of $(T_s/n \text{ s})$ according to the phase difference during the decimation.

The filter set having the n impulse responses and obtained through the above procedure is called a poly-phase filter, the characteristics of which are as follows.

(1) The response properties of the poly-phase filter constituted of the n element filters have the desired pass band characteristics.

(2) The number of taps of the respective filters should be odd and a discontinuity exists at the normalized frequency $\omega=\pi$ in such a case. If the number of taps of the respective filters is even, the discontinuity exists at the normalized frequency $\omega=0$, and the filter cannot be used when the data has a DC component. That is why the number of taps of the respective filters should be odd.

(3) The group delays of the respective filters are even and increase by $(T_s/n \text{ s})$ from $((L-2)/2\ T_s)$ to $(L/2\ T_s)$.

The third property (3) is applied when the difference of the group delays is not more than 1 sampling period. However, the poly-phase filter of the present invention can be applied when the difference of the group delays is over 1 sampling period. Namely, if a delay device is added before and after the decimated filter set shown in FIG. 4, the group delays can also be controlled.

Meanwhile, to achieve the above property (1) the poly-phase filter should be designed to satisfy the following conditions.

A sufficient passband should be secured.

The amplitude ripple of all the filters in the pass band should be within a certain range.

The group delay ripple in the pass band should be planned to be within a certain range.

The poly-phase filter can be realized by designing the mother filter which has a (L×n) taps and whose cut-off frequency is (1/n) using a Kaiser window method to satisfy the above conditions.

Figure 10:
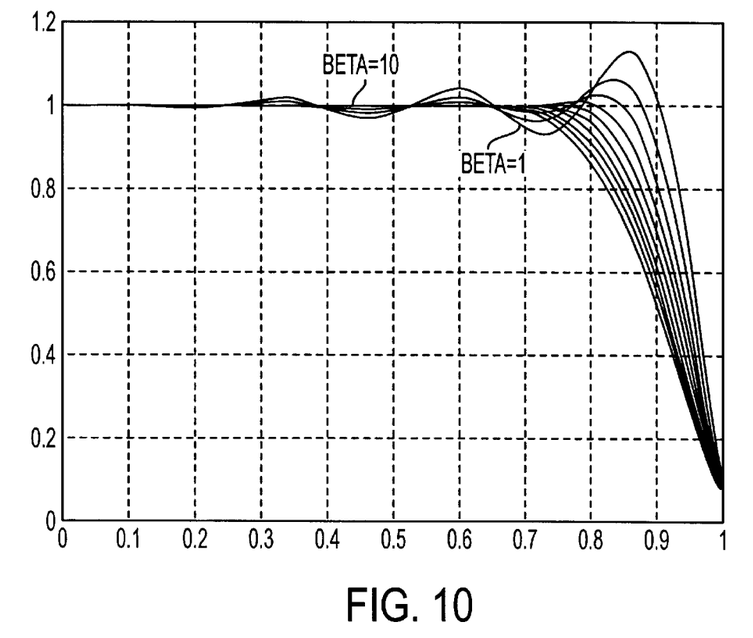
FIGS. 10 and 11 respectively show the amplitude and phase characteristics according to a change in the beta value of the mother filter constituted of a low pass FIR filter using a Kaiser window method.
Figure 11:
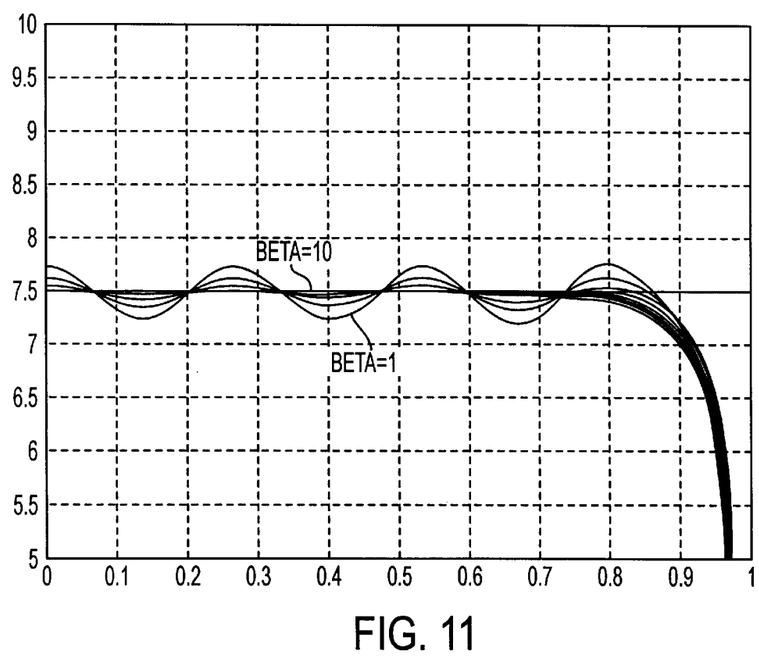
Figure 12:
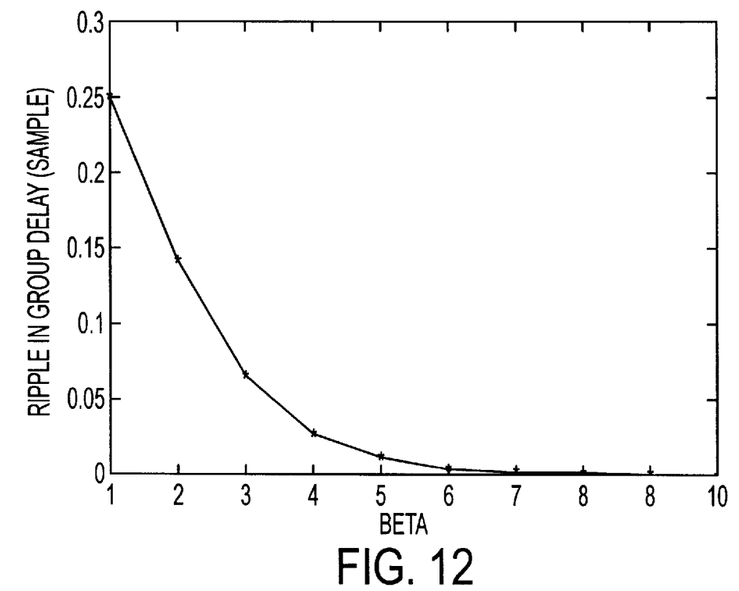
FIG. 12 shows the relation between the ripple and the beta of the group delay characteristics of the mother filter constituted of the low pass FIR filter using the Kaiser window method.

Here, the characteristic changes of the filter, according to the changes in the number of taps of the respective element filters and changes in beta in designing the mother filter using the Kaiser window method, are shown in FIGS. 10 to 12.

FIGS. 10 and 11 show the characteristics of the amplitude and phase, respectively, when the beta value of the mother filter constituted of the low pass FIR filter is changed from 1 to 10 using the Kaiser window method.

At this time, the number of taps L of the filters, the quantity n, and the change quantity of the group delay are respectively set to 15, 20, and $(T_s/20)$, and the first filter having the largest ripple is shown. Here, it is noted that when the beta value is small, cutoff characteristics are good as shown in FIG. 10; however, the ripple is large as shown in FIG. 11. Also, when the beta value is large, the cutoff characteristics are bad as shown in FIG. 10, however, the ripple is small, thus the phase characteristics are flat as shown in FIG. 11. To satisfy the above third property, the beta value should be selected be a large value.

Figure 13:
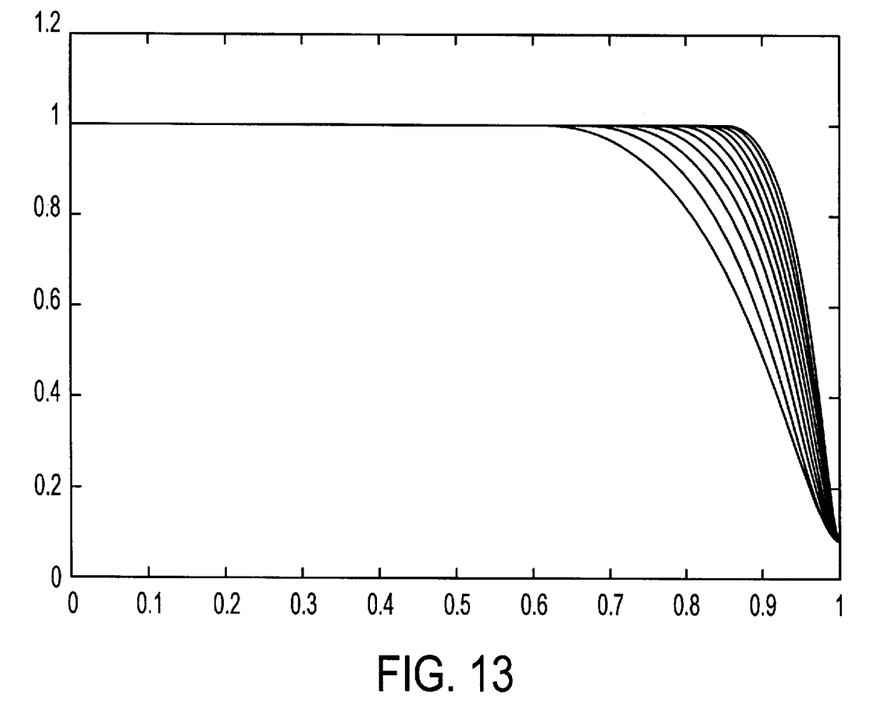
FIGS. 13 and 14 respectively show the amplitude and group delay characteristics of the filter set constituted of the low pass FIR filter using the Kaiser window method.
Figure 14:
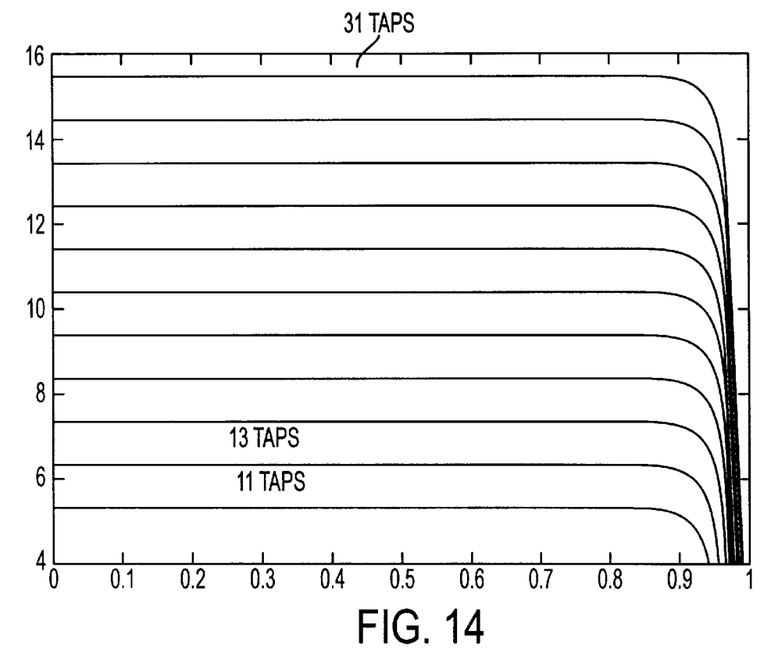

FIG. 12 shows the relation between the group delay ripple and the beta value when the phase error of the mother filter constituted of the low pass FIR filter using the Kaiser window method is restricted to 10%. From the drawing, it is noted that the beta should be not be less than 6 since the larger the beta value, the smaller the ripple FIGS. 13 and 14 show the characteristics of the amplitude and phase of the filter set constituted of the low pass FIR filter using the Kaiser window method.

Figure 15:
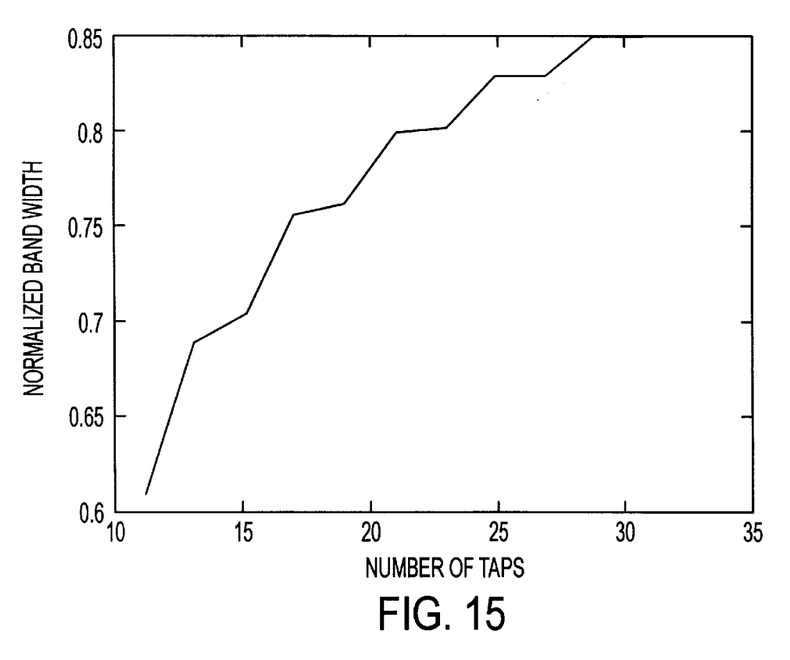
FIG. 15 describes the relation between a band which generates the group delay error of 10% and the tap numbers of the filter.

FIG. 15 shows the relation between the band generating the group delay error and the number of taps of the filter. It is noted that the larger the number of taps, the wider the pass band.

Therefore, it is noted that the design according to the Kaiser window method, which is based on a Bessel function and has the linear phase characteristics used in designing the filter, provides the best design method. A sufficient degree of evenness of the group delay is obtained when beta is more than 60. It is also noted that the larger the number of taps, the wider the passband.

A preferred embodiment of the poly-phase filter according to the present invention and the timing error compensating device and method using the same are described with reference to the attached drawings.

Figure 16:
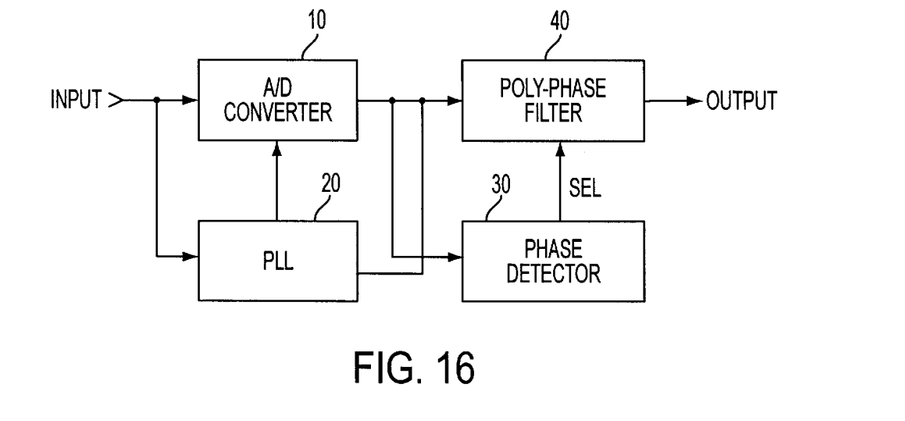
FIG. 16 is a block diagram of a timing error compensating device according to an embodiment of the present invention.

FIG. 16 is a block diagram according to an embodiment of the timing error compensating device of the present invention.

The device shown in FIG. 16 comprises an A/D converter 10 for converting an input signal into a digital signal, a phase locked loop PLL 20 for generating a clock signal to be synchronized with the input signal and supplying it to the A/D converter 10, a phase detector 30 for detecting the phase of the signal converted into the digital signal, and a poly-phase filter 40 constituted of the filter set having different group delay characteristics for selecting the filter which compensates for the group delay corresponding to the detected phase and which compensates for a phase error and a timing error of the converted is digital signal.

The operation of the device shown in FIG. 16 is described as follows.

According to FIG. 16, the input signal is a RLL (run length limited) coded data. For example, the format may include a minimum run length d, a maximum run length k, a code length of input data m, and a code length of transmitted data n. The coded data input to the A/D converter 10 includes a timing error which was generated while being transmitted through a channel.

The timing error of the digital signal output from the A/D converter 10 is primarily corrected by being sampled according to the clock signal generated by the PLL 20.

Here, the PLL 20 is preferably constituted of an analog PLL having a simple structure including a phase detector, a loop filter and a voltage oscillator instead of a digital PLL which is more complicated.

At this time, the digital signal output by the A/D converter 10 has a sampling phase error due to the loop delay of the PLL 20, and a residual timing error due to a time constant of a loop filter which is included in the PLL 20 and a feed back characteristic.

Figure 17:
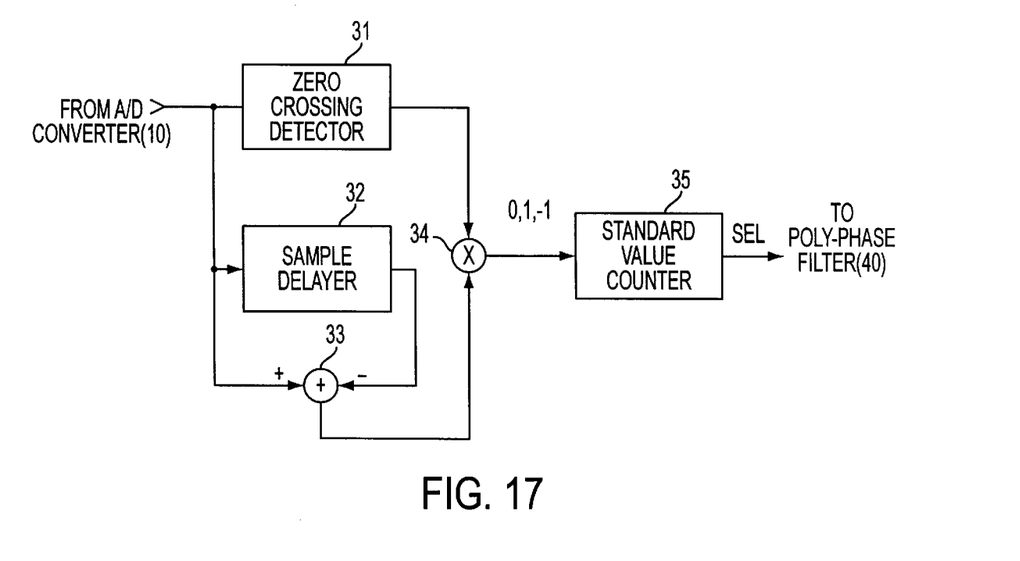
FIG. 17 is a detailed block diagram of a phase detector shown in FIG. 16.

The timing error and the phase error of the signal supplied from the A/D converter 10 are detected in the phase detector 30 and are further corrected in the poly-phase filter 40. The detailed circuit diagram of the phase detector 30 is shown in FIG. 17.

Here, the phase detection is performed using the fact that two zero crossed adjacent samples have the same phase when the absolute values of the samples are identical. In case the input signal has a phase error, the two zero crossed adjacent samples have different values.

In a zero crossing detector 31, when a present sample data has a positive value and the previous sample data has a negative value, −1 is output. When the present sample data has a negative value and the previous sample data has a positive value, 1 is output, and when the present sample data and the previous sample data are identical, 0 is output.

In a sample delay 32, the data output from the A/D converter 10 is delayed during one sample period. A subtracter 33 subtracts the present sample data which is output from the A/D converter 10 from the previous sample data which is output from the sample delay 32. In multiplier 34, the result of the above subtraction is multiplied by the result detected from the zero-crossing detector 31.

An average value counter 35 accumulates the multiplied result during a predetermined sample period and divides the accumulated result by the number of sample periods to obtain an average value. The average value is supplied to a poly-phase filter 40 shown in FIG. 16 as a filter selection control signal SEL for selecting an element filter to compensate for the group delay.

Figure 18:
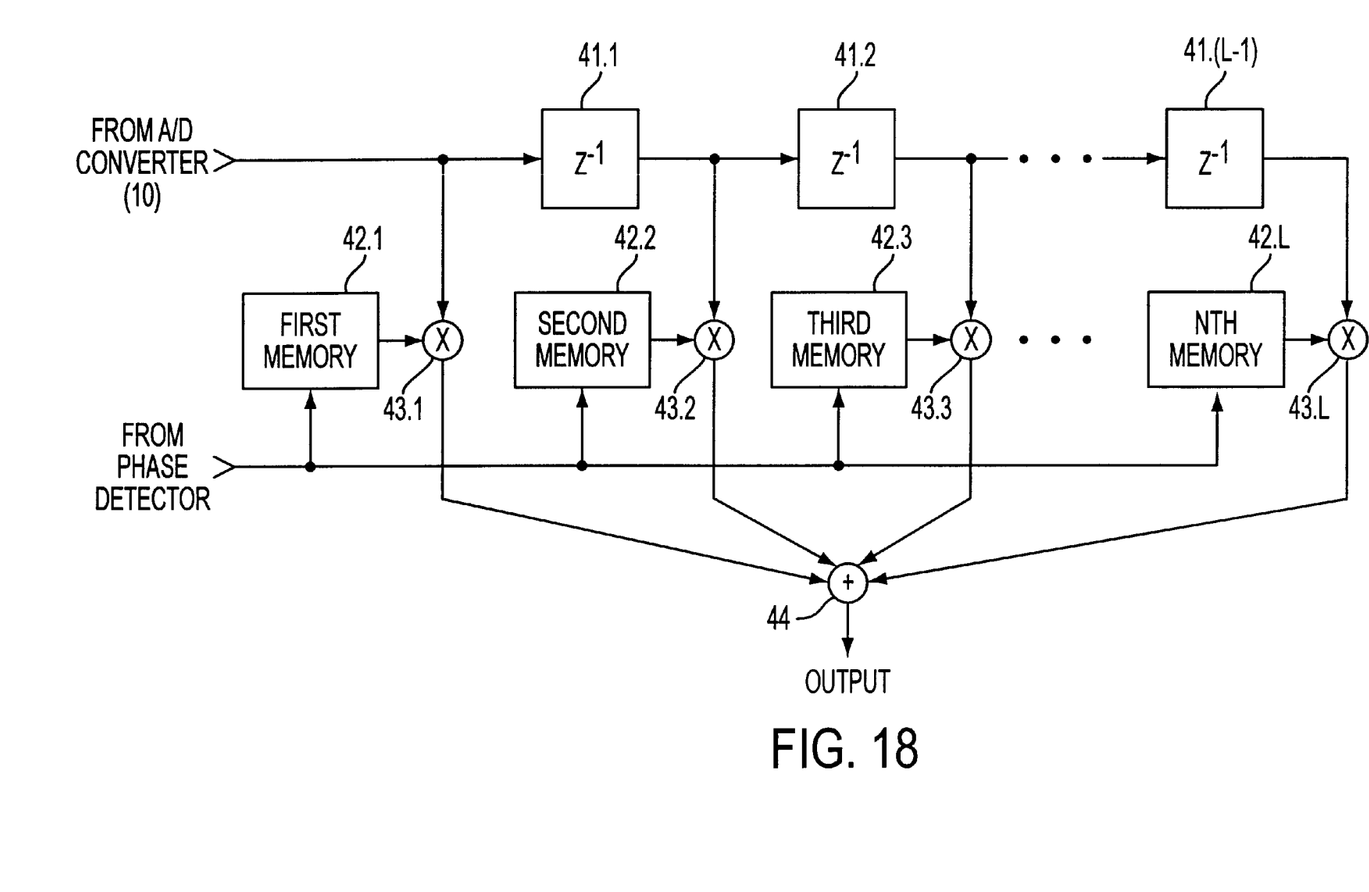
FIG. 18 is a detailed circuit diagram of the poly-phase filter shown in FIG. 16.

FIG. 18 is a detailed circuit diagram of the poly-phase filter shown in FIG. 16. The poly-phase filter shown in FIG. 18 includes L−1 delays 41.1–41.(L−1), (L corresponds to the number of taps.) L memories 42.1–42.L in which n coefficients of the respective filters are stored, a first multiplier 43.1 for multiplying the data output from the A/D converter 10 with the filter coefficients output from the first memory 42.1 depending on the filter selection signal SEL, second to Lth multipliers 43.2–43.L for respectively multiplying the delayed data of the respective delays 41.1–41.(L−1) with the filter coefficients output from second to Lth memories 42.2–42.L depending on the filter selection signal SEL, and an adder 44 for adding the outputs of the first to Lth multipliers 43.1–43.L.

During the operation of the poly-phase filter shown in FIG. 18, the coefficients of the n filters are stored in the respective L memories 42.1–42.L.

For example, the coefficients of the first filter $b_0$, $b_n$, $b_{2n}$, . . . , $b_{Ln}$, . . . , are stored in a first address of the respective L memories. The coefficients of the second filter $b_1$, $b_{n+1}$, $b_{2n+1}$, . . . , $b_{(L-1)n+1}$ of the second filter are stored in a second address of the respective memories. Similarly, the coefficients of the n-th filter $b_{n-1}$, $b_{2n-1}$, $b_{3n-1}$, . . . , $b_{Ln-1}$ are stored in an n-th address of the respective memories.

Here, the L memories 42.1–42.L can be constituted of a memory in which the coefficients corresponding to the number of taps of the respective n filters are stored.

Depending on the filter select signal SEL corresponding to the detected phase error, one of the n addresses of each of the L memories are selected. The coefficients of the filter stored in the selected address of each of the memories are read and supplied to the second input port of the respective multipliers 43.1–43.L.

The present input sample data which are input from the A/D converter 10 of FIG. 16 and the delayed data of the respective delayers 41.1–41.(L−1) are supplied to the first input port of the respective multipliers 43.1–43.L. In the first multiplier 43.1, the filter coefficients read from the memory 42.1 are multiplied by the input sample data. In the other multipliers 43.2–43.L, the filter coefficients read from the memories 42.2–42.L are multiplied by the delayed data of the delay 41.1–41.(L−1). In an adder 44, the outputs of the multipliers 43.1–43.L are added and are then output. The added output becomes a signal in which the phase error and the timing error have been compensated for.

Figure 19:
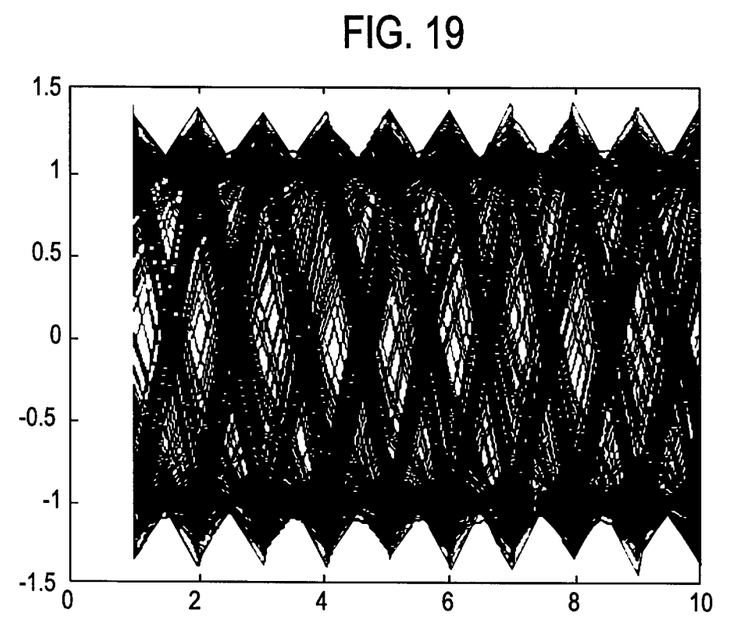
FIGS. 19 and 20 are eye patterns showing signals before and after the timing error compensation, respectively.
Figure 20:
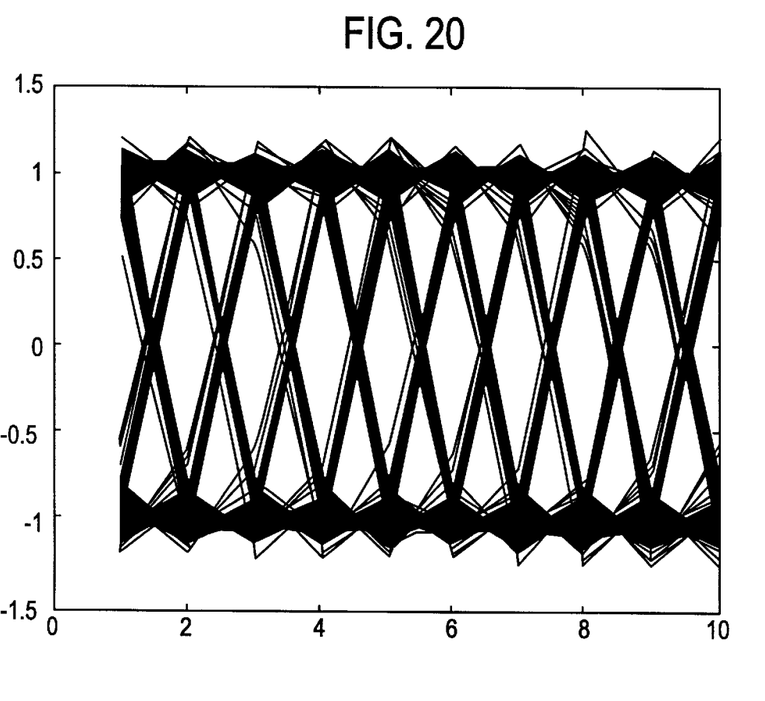

FIG. 19 is an eye pattern of the signal having sampling error. FIG. 20 is the eye pattern of the signal after compensation.

The result of performing a simulation of the RLL code in which (d,k)=(2,10) is shown under the conditions that the frequency of the timing error component is 0.001, the variance of the timing error is $\sigma=0.5T_s$, and a symbol rate sampling is performed per one sample.

The present invention can be widely used in a data recording and reproducing apparatus, a data transmitting and receiving apparatus, and a digital signal processing apparatus.

The present invention can compensate for the phase and timing errors using a sampling frequency and can be constructed smaller and more cheaply than the device performing timing and phase error compensation using the digital PLL which requires a high sampling frequency and a high degree of accuracy. In addition, the present invention can compensate for the group delay characteristics.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A poly-phase filter comprising a series of element filters having different group delay characteristics, said element filters obtained from impulse responses from a mother filter having a pass band of (Fs/2n) where Fs is a sampling frequency and n is an integer, down-sampling said obtained impulse responses according to a plurality of clock signals having a phase difference of ($2*\pi/n$ s), and using said down-sampled respective impulse responses as transmitting characteristics of the respective element filters.

2. A poly-phase filter as claimed in claim 1, wherein the phases of said plurality of clock signals are proportionate to the group delay characteristics.

3. A poly-phase filter as claimed in claim 1, wherein the respective element filters and said mother filter are low pass FIR filters.

4. A poly-phase filter as claimed in claim 1, wherein the respective element filters and said mother filter are low pass FIR filters derived using a Kaiser window method.

5. A poly-phase filter as claimed in claim 4, wherein the respective element filters and said mother filter are low pass FIR filters derived using a Kaiser window method in which a beta value is more than 6.

6. A poly-phase filter as claimed in claim 1, wherein a number of taps of the respective element filters is odd.

7. A poly-phase filter as claimed in claim 1, wherein the respective element filters of said filter set have pass band response characteristics.

8. A poly-phase filter as claimed in claim 1, wherein the group delays of the element filters of said filter set increase by ($T_s/n$ s) for each respective element filter wherein ($T_s = 1/f_s$), and wherein the group delays fall within one sampling period.

9. A poly-phase filter as claimed in claim 1, wherein the group delays of said filter set are controlled to be more than one sampling period by including delay devices before and after said filter set.

10. A poly-phase filter as claimed in claim 8, wherein the number of impulse responses of said mother filter is the value obtained by multiplying the number L of responses of the respective element filters and a positive number n.

* * * * *